United States Patent
Chuang et al.

(10) Patent No.: US 9,184,521 B2
(45) Date of Patent: Nov. 10, 2015

(54) CONNECTOR ASSEMBLY AND ELECTRONIC DEVICE

(71) Applicant: HTC Corporation, Taoyuan County (TW)

(72) Inventors: I-Cheng Chuang, Taoyuan County (TW); Yu-Jing Liao, Taoyuan County (TW); Ying-Yen Cheng, Taoyuan County (TW); Chih-Wei Tu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 203 days.

(21) Appl. No.: 14/017,318

(22) Filed: Sep. 4, 2013

(65) Prior Publication Data

US 2015/0064966 A1    Mar. 5, 2015

(51) Int. Cl.

| H01R 13/516 | (2006.01) |
| H01R 12/77 | (2011.01) |
| H01R 12/72 | (2011.01) |
| G06F 1/16 | (2006.01) |
| H01R 4/28 | (2006.01) |
| H01R 4/48 | (2006.01) |
| H01R 12/59 | (2011.01) |
| H01R 12/62 | (2011.01) |
| H01R 43/00 | (2006.01) |
| H05K 1/14 | (2006.01) |
| H05K 1/18 | (2006.01) |

(52) U.S. Cl.
CPC ............... *H01R 12/778* (2013.01); *G06F 1/16* (2013.01); *H01R 12/722* (2013.01); *H01R 13/516* (2013.01); *H01R 4/28* (2013.01); *H01R 4/4809* (2013.01); *H01R 12/592* (2013.01); *H01R 12/62* (2013.01); *H01R 43/002* (2013.01); *H05K 1/147* (2013.01); *H05K 1/189* (2013.01); *H05K 2201/10265* (2013.01)

(58) Field of Classification Search
CPC ....................................................... H01R 12/778
See application file for complete search history.

(56) References Cited

U.S. PATENT DOCUMENTS

| 4,054,348 | A | * | 10/1977 | Stroupe et al. | ................ | 439/329 |
| 4,824,391 | A | * | 4/1989 | Ii | .................... | 439/329 |
| 5,971,806 | A | * | 10/1999 | Evans et al. | ................... | 439/632 |
| 6,000,951 | A | * | 12/1999 | Hansen et al. | .................. | 439/67 |
| 7,374,429 | B2 | * | 5/2008 | Cronch et al. | .................. | 439/67 |
| 7,491,102 | B2 | * | 2/2009 | Mori et al. | .................... | 439/886 |
| 2012/0040541 | A1 | * | 2/2012 | Liskow | .......................... | 439/67 |
| 2015/0064966 | A1 | * | 3/2015 | Chuang et al. | ................ | 439/571 |

* cited by examiner

*Primary Examiner* — James Harvey
(74) *Attorney, Agent, or Firm* — Jianq Chyun IP Office

(57) ABSTRACT

A connector assembly adapted to be disposed in a casing of an electronic device is provided. The connector assembly includes a connector and a locking member. The locking member includes a supporting portion and a holding portion connected to the supporting portion. The connector is disposed on the supporting portion. The locking member is adapted to clamp at an end of a substrate disposed in the casing, and the supporting portion and the holding portion lean against an upper side and a lower side of the end of the substrate respectively. An electronic device including the connector assembly aforementioned is also provided.

11 Claims, 2 Drawing Sheets

CONNECTOR ASSEMBLY AND ELECTRONIC DEVICE

BACKGROUND

1. Field of the Disclosure

The application is directed to a connector assembly and more particularly, to a connector assembly applied to an electronic device.

2. Description of Related Art

In recent years, electronic devices, such as notebooks (NB), tablet computers, and smart phones, have been widely used in our daily life along with the development of technologies. Types and functions of the electronic devices are increasingly diversified, and the electronic devices are more popular due to convenience and practicality thereof and can be used for different purposes.

In addition to the functions of electronic products themselves, a connector is commonly installed in an electronic device, such that an electronic card (E-card) (e.g., a subscriber identity module (SIM) card or a memory card) can be inserted into the electronic device for expanding functions, or the electronic device can be connected to other external devices, such as a universal serial bus (USB) connector. Taking an E-card connector as an example, such type of connector is commonly fixed to a printed circuit board (PCB) in a casing so as to be electrically connected with the PCB. Due to the current electronic devices trending toward being light and thin, a glass cover, a touch panel, a display and any other component are commonly adhered to the PCB, such that the internal components of an electronic device can be disposed closely. However, when the connector is damaged, during the repair process, most of the components (e.g., the display) have to be detached before disassembling the connector, such that the internal portion of the electronic device can be exposed. The aforementioned detachment way is more complicated and leads the increase of the repair cost of the electronic device.

SUMMARY

The application is directed to a connector assembly which can be easily disassembled.

The application is directed to an electronic device applying the connector assembly and having lower repair cost.

The application is directed to a connector assembly adapted to be disposed in a casing of an electronic device. The connector assembly includes a connector and a locking member. The locking member includes a supporting portion and a holding portion connected to the supporting portion. The connector is disposed on the supporting portion. The locking member is adapted to clamp at an end of a substrate in the casing, and the supporting portion and the holding portion respectively against an upper side and a lower side of the end of the substrate.

The application is directed to an electronic device including a casing, a substrate and a connector assembly. The substrate is located in the casing. The connector assembly is disposed in the casing. The connector assembly includes a connector and a locking member. The locking member includes a supporting portion and a holding portion connected to the supporting portion. The connector is disposed on the supporting portion. The locking member is adapted to clamp at an end of the substrate, and the supporting portion and the holding portion respectively lean against the upper side and the lower side of the end of the substrate.

Based on the above, in the connector assembly of the application, the connector is disposed on the locking member, and the locking member includes the supporting portion and the holding portion connected to the supporting portion, such that the locking member is adapted to clamp at the end of the substrate with the supporting portion and the holding portion. Due to the connector assembly of the application assembled to the substrate with the locking member, the connector can be removed from the substrate merely by pulling the locking member toward the outside of the substrate. Accordingly, the connector assembly of the application is provided with an easy detaching means, such that the electronic device applying the connector assembly has lower repair cost.

In order to make the aforementioned and other features and advantages of the disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
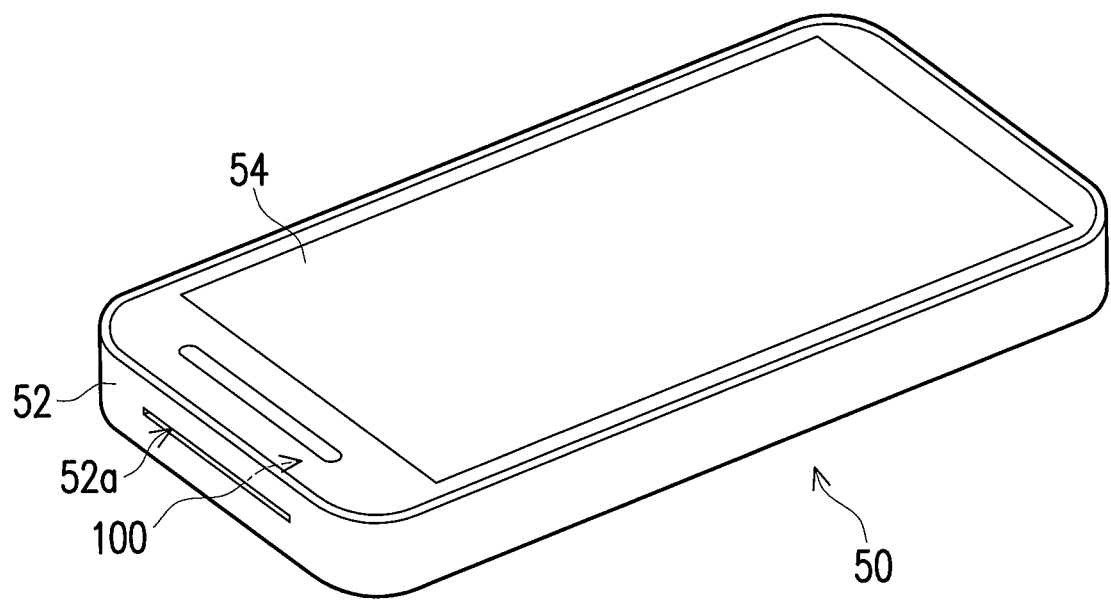
FIG. 1 is a schematic diagram illustrating an electronic device according to an embodiment of the invention.

FIG. 1 is a schematic diagram illustrating an electronic device according to an embodiment of the invention. With reference to FIG. 1, in the present embodiment, an electronic device 50 includes a casing 52, a display 54 and a connector assembly 100. The display 54 is disposed on the casing 52 to display images. A side surface of the casing 52 (e.g., a side surface corresponding to the top of the electronic device 50) has an opening 52a. The connector assembly 100 is disposed in the casing 52 of the electronic device 50 and corresponding to the opening 52a. In the present embodiment, the electronic device 50 is, for example, a smart phone. The electronic device 50 may also include a main body that is not shown and may be equipped with a touch panel or any other component (e.g., an audio device) commonly used therein. The application is not intent to limit the other components and the type of the electronic device 50.

Figure 2:
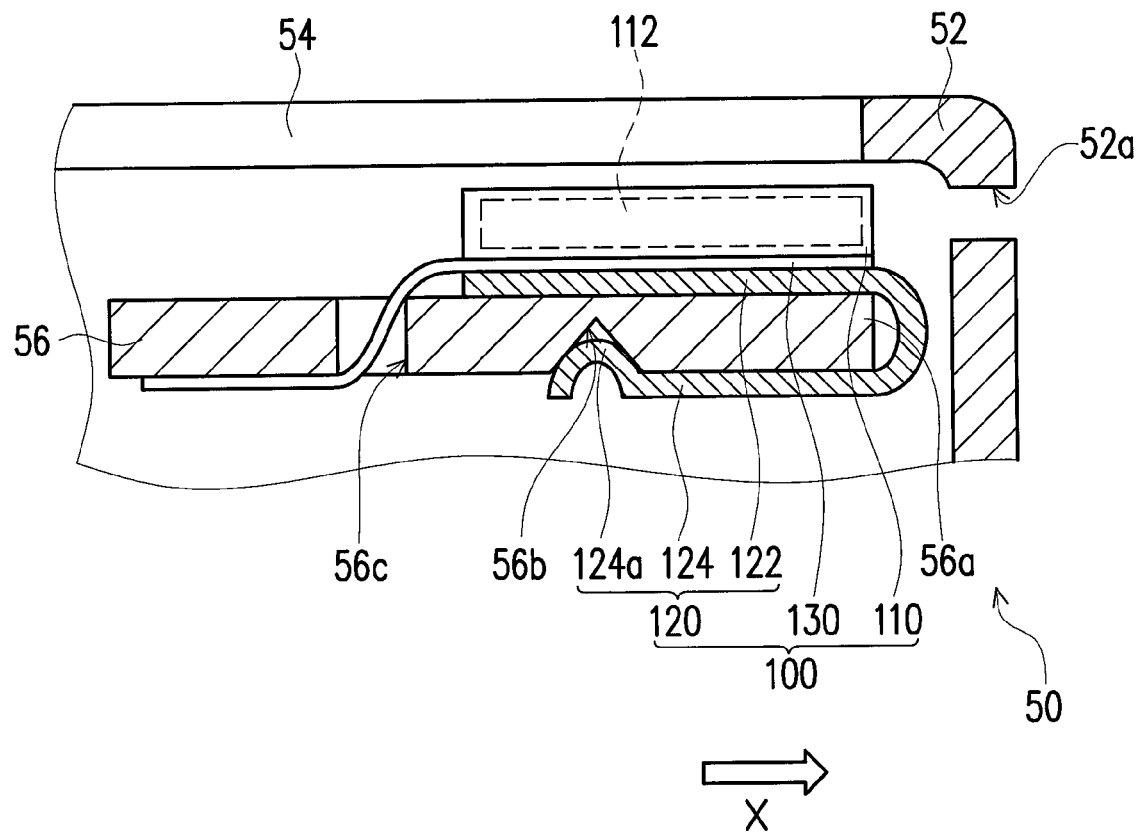
FIG. 2 is a schematic diagram illustrating the connector assembly depicted in FIG. 1 when being applied to the electronic device.

FIG. 2 is a schematic diagram illustrating the connector assembly depicted in FIG. 1 when being applied to the electronic device. To be more specific, with reference to FIG. 2 as shown in the present embodiment, the connector assembly 100 is disposed in the casing 52 and corresponding to the opening 52a. The connector assembly 100 includes a connector 110, a locking member 120 and a flexible printed circuit board (FPC) 130. The locking member 120 includes a supporting portion 122 and a holding portion 124 connected to the supporting portion 122. The connector 110 is disposed on the supporting portion 122. The FPC 130 is located between the connector 110 and the supporting portion 122 of the locking member 120, and the connector 110 is electrically connected with the FPC 130. The FPC 130 may be connected with a printed circuit board (PCB) or another FPC located in the casing 52, such that the connector 110 is electrically connected with the PCB or said another FPC.

Additionally, the electronic device 50 of the present embodiment further includes a substrate 56. The substrate 56 is located in the casing 52, and the display 54 is fixed onto the substrate 56 and covers the connector 110. For instance, the display 54 may be fixed to the substrate 56 by adhering means and covers the connector 110. The substrate 56 may be a PCB or an internal frame and has an opening 56c. The application is not intent to limit the type of the substrate 56. The FPC 130 may extend to a location below the substrate 56 through the opening 56c. In other words, the application is not intent to limit relative positions of the FPC 130 and the substrate 56. By disposing FPC 130 which extends to different surfaces of the substrate 56 through the opening 56c, the connection between the connector 110 and the FPC 130 can be more flexible. The holding portion 124 of the locking member 120 is connected to the supporting portion 122, and the holding portion 124 and the supporting portion 122 are opposite and separated from each other by an interval. Thereby, the locking member 120 is adapted to clamp at an end 56a of the substrate 56 in the casing 52, and the supporting portion 122 and the holding portion 124 respectively lean against the upper side and the lower side of the end 56a. To be detailed, in the present embodiment, the locking member 120 may be U-shaped and include the supporting portion 122 and the holding portion 124, the holding portion 124 extending from an edge of the supporting portion 122 and reversely bending by 180 degrees. By doing so, the U-shaped locking member 120 is adapted to clamp at the end 56a of the substrate 56 in the casing 52, and the supporting portion 122 and the holding portion 124 respectively lean against the upper side and the lower side of the end 56a. Nevertheless, the locking member 120 is not limited to be U-shaped and may be in any other shape with the clamping function.

In the present embodiment, the connector 110 may be an electronic card connector (e.g., a subscriber identity module (SIM) card) adapted to contain an electronic card (E-card) 112 (e.g., a SIM card). The E-card 112 is inserted into the connector 110 from the external of the electronic device 50 through the opening 52a and is contained in the connector 110. The connector 110 has a plurality of conductive terminals which is not shown. The conductive terminals are electrically connected to the FPC 130, and the connector 110 where the E-card 112 is inserted contacts the conductive terminals. In another embodiment, the connector may be another type of E-card connector, such as a memory card connector adapted to contain a memory card. Alternatively, in still another embodiment, the connector may also be a jack connector (e.g., a USB connector) and adapted to contain a plug connector. The application is not intent to limit the type of the connector.

Moreover, in the present embodiment, the holding portion 124 of the locking member 120 has a first positioning structure 124a, and the substrate 56 has a second positioning structure 56b located at the end 56a. The first positioning structure 124a is engaged with the second positioning structure 56b of the substrate 56 to fix the locking member 120 to the substrate 56. In more detail, the first positioning structure 124a of the present embodiment is a protrusion structure, while the second positioning structure 56b is a recess structure. Thereby, the first positioning structure 124a may be lodged in the second positioning structure 56b to fix the locking member 120 to the substrate 56. In other words, the first positioning structure 124a and the second positioning structure 56b are capable of preventing the locking member 120 from moving in a direction (e.g., a direction illustrated in FIG. 2) toward the outside of the substrate 56. However, in another embodiment, the first positioning structure may be a recess structure, and the second positioning structure may be a protrusion structure, such that the first positioning structure may lock the second positioning structure to fix the locking member 120 to the substrate 56. Alternatively, in still another embodiment, the first positioning structure and the second positioning structure may be any positioning structures that are capable of being engaged or fixed with each other, and the application is not intent to limit the types of the first positioning structure and the second positioning structure.

In the present embodiment, with the interval between the holding portion 124 and the supporting portion 122, the locking member 120 may be assembled to the substrate 56 and clamp the end 56a of the substrate 56. When the connector 110 needs to be repaired or replacement, a part of the casing 52 (e.g., the back cover) that is corresponding to the connector assembly 100 is first removed to expose the locking member 120 of the connector assembly 100. Then, since the locking member 120 is fixed to the substrate 56 by the first positioning structure 124a lodged in the second positioning structure 56b, an external force is required to release the fixing relation. To be detailed, the locking member 120 may be pulled toward the outside of the substrate 56 (e.g., along the direction X illustrated in FIG. 2) by applying a force to the connection part between the holding portion 124 and the supporting portion 122, such that the first positioning structure 124a departs from the second positioning structure 56b, and the locking member 120 is removed from the end 56a of the substrate 56. After the connector 110 is removed from the connector assembly 100, a new connector 110 may be clamped at the end 56a of the substrate 56 through the locking member 120 fixed to the substrate 56, by lodging the first positioning structure 124a into the second positioning structure 56b. Accordingly, the connector 110 may be clamped at the end 56a of the substrate 56 or removed from the substrate 56 through the locking member 120, and thereby, when detaching or assembling the connector 110, most components (e.g., the display 54) of the electronic device 50 do not need to be detached, and the connector 110 may be removed from the substrate 56 and the new connector may be assembled to the substrate 56 after exposing the locking member 120 of the connector assembly 100. To be more detailed, even though the display 54 is fixed onto the substrate 56 and covers the connector 110, in the application, the rework process can be performed by merely detaching the connector assembly 100 without removing the display. Accordingly, the connector assembly 100 of the present embodiment can be easily disassembled, by which the time and the steps for repair can be simplified, and the electronic device 50 applying the connector assembly 100 can have lower repair cost.

To sum up, in the connector assembly of the application, the connector is disposed on the locking member, wherein the locking member includes the supporting portion and the holding portion connected to the supporting portion, such that the locking member is adapted to clamp at the end of the substrate with the supporting portion and the holding portion. Accordingly, during the repair process of the connector assembly, merely by pulling the locking member toward the outside of the substrate, the connector assembly can be removed from the substrate, such that the connector assembly can be easily disassembled. In the meantime, by pulling the locking member toward the outside of the substrate, the connector assembly can be detached without damaging the electronic device. Accordingly, the electronic device applying the connector assembly can save the time for disassembly and assembly, and the simplified detaching steps facilitates in reduction of the cost of repairing or replacing components during the repair process, such that the electronic device can have lower repair cost.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A connector assembly, adapted to be disposed in a casing of an electronic device, the connector assembly comprising:
   a connector; and
   a locking member, comprising a supporting portion and a holding portion connected to the supporting portion, wherein the connector is disposed on the supporting portion, the locking member is adapted to clamp at an end of a substrate disposed in the casing, and the supporting portion and the holding portion respectively lean against an upper side and a lower side of the end of the substrate; and
   a flexible printed circuit board, located between the connector and the locking member, and the flexible printed circuit board being electrically connected with the connector, wherein the substrate has an opening, and the flexible printed circuit board extends to a location below the substrate through the opening.

2. The connector assembly according to claim 1, wherein the holding portion has a first positioning structure adapted to be engaged with a second positioning structure of the substrate to fix the locking member onto the substrate.

3. The connector assembly according to claim 2, wherein the first positioning structure is a protrusion structure, the second positioning structure is a recess structure, and the first positioning structure is adapted to be lodged into the second positioning structure.

4. An electronic device, comprising:
   a casing;
   a substrate, located in the casing; and
   a connector assembly, disposed in the casing, wherein the connector assembly comprises:
      a connector; and
      a locking member, comprising a supporting portion and a holding portion connected to the supporting portion, wherein the connector is disposed on the supporting portion, the locking member is adapted to clamp at an end of the substrate disposed in the casing, and the supporting portion and the holding portion respectively lean against an upper side and a lower side of the end of the substrate; and
      a flexible printed circuit board, located between the connector and the locking member, and the flexible printed circuit board is electrically connected with the connector, wherein the substrate has an opening, and the flexible printed circuit board extends to a location below the substrate through the opening.

5. The connector assembly according to claim 1, wherein the connector is an electronic card connector or a jack connector.

6. The electronic device according to claim 4, further comprising:
   a display, fixed onto the substrate and covering the connector.

7. The electronic device according to claim 4, wherein the holding portion has a first positioning structure adapted to be engaged with a second positioning structure of the substrate to fix the locking member onto the substrate.

8. The electronic device according to claim 7 wherein the first positioning structure is a protrusion structure, the second positioning structure is a recess structure, and the first positioning structure is lodged into the second positioning structure.

9. The electronic device according to claim 4, wherein a side surface of the casing has an opening, and the connector is disposed in the casing and corresponding to the opening.

10. The electronic device according to claim 4, wherein the substrate is a printed circuit board or an internal frame.

11. The electronic device according to claim 4, wherein the connector is an electronic card connector or a jack connector.

* * * * *